United States Patent [19]

Stephens

[11] 4,379,639
[45] Apr. 12, 1983

[54] ALARM WATCH WITH REMOTE SONIC AMPLIFIER

[76] Inventor: Eugene Stephens, 19311 Montrose, Detroit, Mich. 48235

[21] Appl. No.: 196,542

[22] Filed: Oct. 14, 1980

[51] Int. Cl.³ .............................................. G04B 47/00
[52] U.S. Cl. ..................................... 368/12; 368/250
[58] Field of Search ................. 368/10, 12, 47, 72–74, 368/250, 281, 245, 315–317, 276, 278; 340/384 R, 384 E

[56] References Cited

U.S. PATENT DOCUMENTS

| 3,144,706 | 3/1964 | Willis | 368/159 |
| 3,361,974 | 1/1968 | Wysong | 368/296 X |
| 3,786,628 | 1/1974 | Fossard et al. | 368/12 |
| 3,788,059 | 1/1974 | Spadini | 368/250 |
| 4,218,875 | 8/1980 | Rothman | 368/12 X |

Primary Examiner—Vit W. Miska
Attorney, Agent, or Firm—Charles W. Chandler

[57] ABSTRACT

An audio amplifier for amplifying the audio signal generated by an alarm watch. The amplifier includes an automatic snooze alarm which is generated a predetermined time after the initial alarm is generated by the watch.

7 Claims, 5 Drawing Figures

ALARM WATCH WITH REMOTE SONIC AMPLIFIER

BACKGROUND OF THE INVENTION

This invention relates to means for remotely amplifying the audio signal generated by an alarm watch and for actuating a snooze alarm in response to the audio signal.

Electronic alarm watches which emit an audible signal at a selected time are useful for reminding its user of certain events during the day. However, such an alarm is not as effective for waking the user up in the morning as an alarm clock. One reason for this is that the size of the watch case limits it to a relatively low power supply. One approach to this problem in the prior art has been to provide a special watch and a remote sonic generator activated by RF, magnetic or optical signals generated by the watch, as illustrated in U.S. Pat. No. 4,144,706 to Willis. However, Willis will not operate with a common commercial alarm watch, and requires a large power supply.

SUMMARY OF THE INVENTION

The preferred embodiment of the present invention comprises a conventional alarm watch that emits an audible sound at a time selected by the user. A box having a pivotal top has an internal member for supporting the watch on the edge of the watch case. An audio sensor, mounted in the box, has an amplifier and a tone generator for amplifying through a speaker the sound generated by the watch. The speaker is mounted in the box cover, remote from the microphone, to help eliminate feedback. The box serves as both a storage and carrying case, as well as an alarm device. The circuitry does not require a large battery and operates with any alarm watch that emits an audible signal.

Both the microphone and the speaker are embedded in a silicone base which functions as a sound dampening material. The microphone has a cone-shaped element forming a highly directional device to reduce its sensitivity to external noises and to concentrate on the sound generated by the watch.

The preferred alarm also has an automatic snooze alarm so that when the user is awakened by the amplified alarm of the watch, the snooze alarm is automatically activated a predetermined time later.

The preferred embodiment has means for discriminating against external noises.

Still further objects and advantages of the invention will become readily apparent to those skilled in the art to which the invention pertains upon reference to the following detailed description.

DESCRIPTION OF THE DRAWINGS

The description refers to the accompanying drawings in which like reference characters refer to like parts throughout the several views, and in which.

DESCRIPTION OF THE PREFERRED EMBODIMENT

Figure 1:
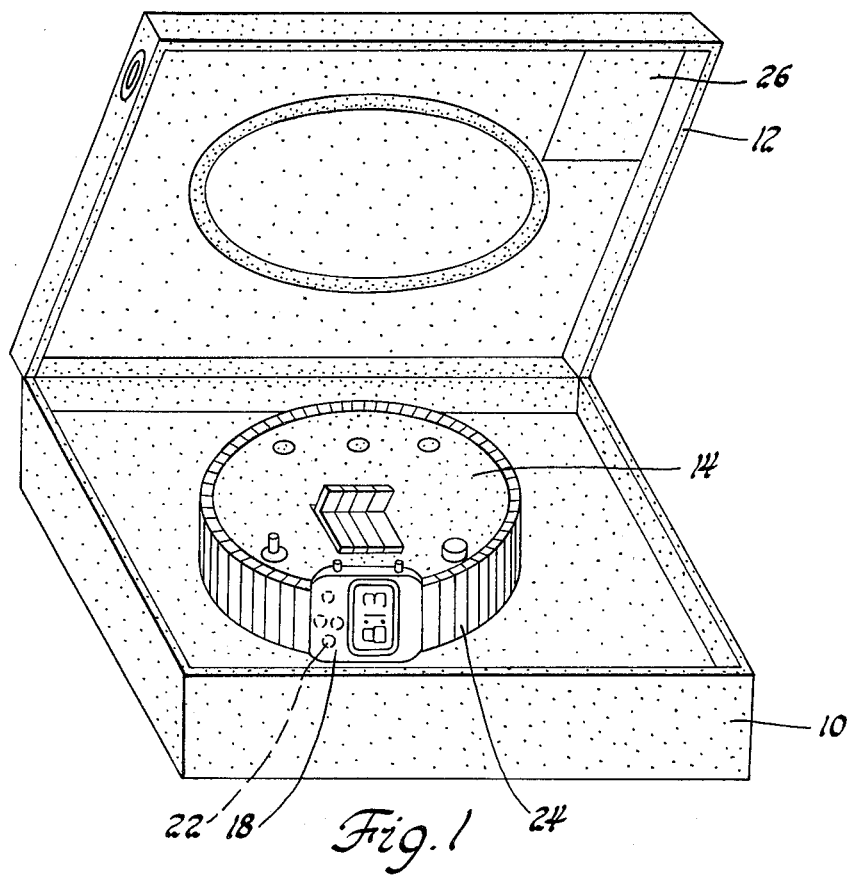
FIG. 1 is a perspective view of an alarm device for amplifying the sound of a conventional alarm watch, including a remote speaker.
Figure 2:
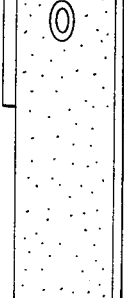
FIG. 2 is an elevational view of the preferred box showing the relationship between the microphone and the speaker.
Figure 3:
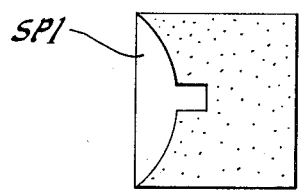
FIG. 3 is a view showing the manner in which the speaker's base is embedded in silicone.

Referring to the drawings, FIG. 1 illustrates a box 10 having a pivotally connected cover 12 movable between open and closed positions. FIG. 1 illustrates the cover in its open position. A raised control panel 14 is supported by a somewhat cylindrical wall 16 in box 10. The height of the wall is adapted to accomodate the width of a conventional watch.

A watch 18 is illustrated in FIG. 1 in the box with the back of the watch case adjacent a wall 20 having openings 22 for receiving an audible signal from the watch. Normally the watch strap 24 is wrapped around wall 20. A speaker housing 26 is mounted adjacent the upper corner of cover 12.

Figure 4:
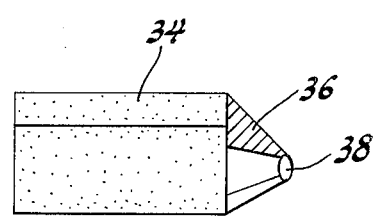
FIG. 4 is a view of the microphone illustrating its cone-shaped head and the silicone base.
Figure 5:
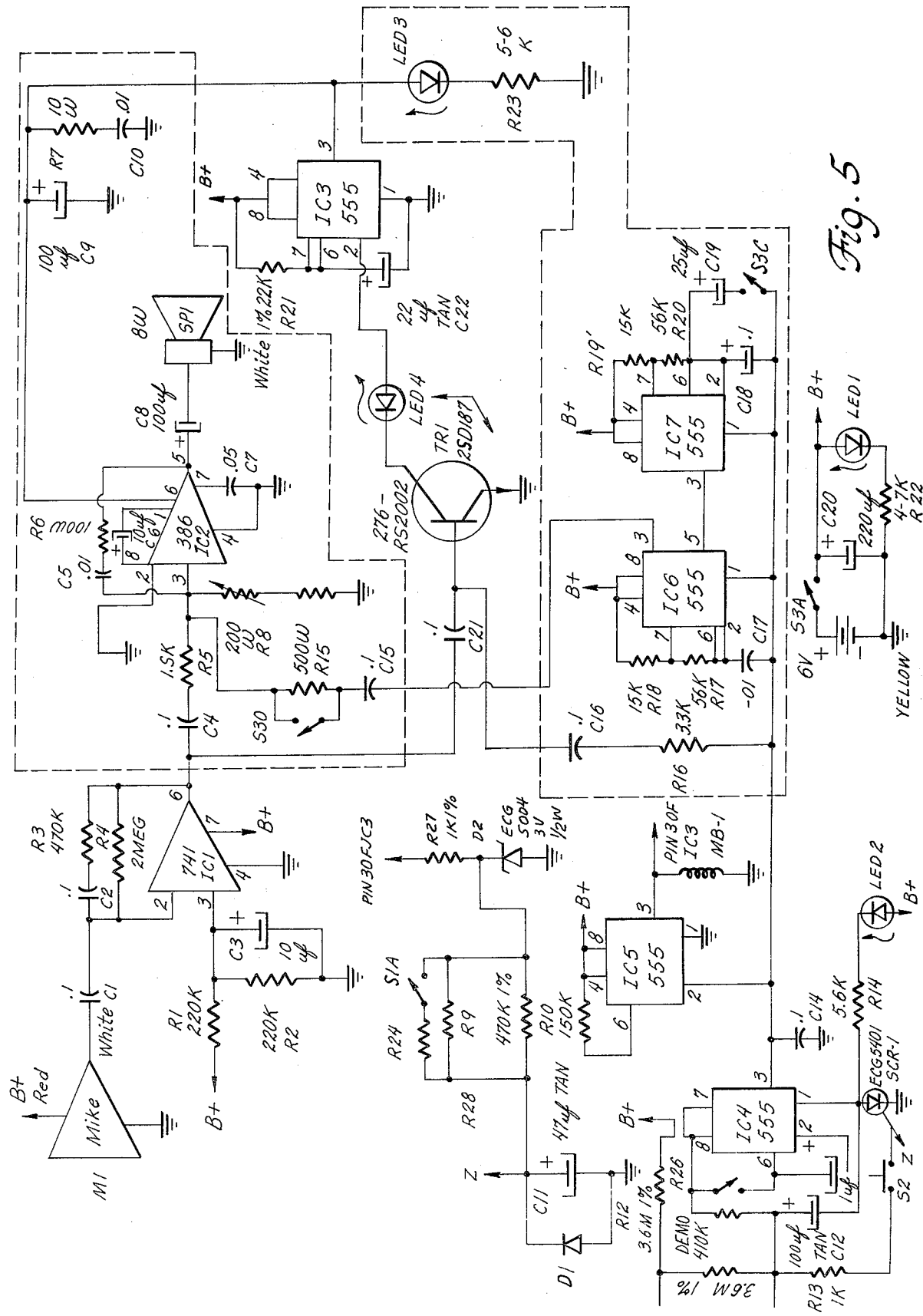
FIG. 5 is a schematic diagram of the preferred circuit.

Referring to FIGS. 4 and 5, an electret condenser microphone M1 is mounted adjacent wall 20 for receiving an audible signal from watch 18. The microphone has its base embedded in a silicone base 34 which functions as a dampening medium. A cone-shaped element 36, having a small opening 38, is mounted on the front of the microphone so that it is highly direction for receiving sound from the watch.

Circuit Description—Preamplifier

The input circuit consists of electret condenser microphone element M1 and an integrated circuit IC1 and associated components. The electret electric condenser microphone element has a highly directional pickup pattern for receiving an audio signal from alarm watch 18. Capacitor C1 couples the signal from microphone M1 to the input of operational amplifier IC1. The operational amplifier serves as a preamplifier for the watch signal received from capacitor C1. Operational amplifier IC1 is operated from a single power supply source and consumes very little current. Operational amplifier IC1 amplifies the watch alarm signal to a level high enough to drive power amplifier IC2. Resistors R1 and R2 bias the operational amplifier so it may be operated from a single supply voltage. The output signal of amplifier IC1 is 180° out of phase with the input signal. Capacitor C3 connects the positive input of amplifier IC1 to ground potential for A.C. voltage. Resistors R3 and R4 and capacitor C2 are connected to establish a feed back network for IC1.

The Power Amplifier

Capacitor C1 couples the signal from the output amplifier IC1 to resistor R5 which reduces the level of the signal being fed to the input of power amplifier IC2. Resistor R5 is used to balance the signal level between tone generators IC6 and IC7 and the alarm watch signal. Capacitor C6 establishes the voltage gain of IC2. Capacitor C7 is a bypass capacitor for IC2 to help quiet the quiesent mode. Capacitor C8 couples the output of power amplifier IC2 to loudspeaker SP1. Resistor R8 is connected to provide volume control for amplifier IC2. Resistor R25 keeps the operator from being able to turn the volume completely down. Capacitor C5 and resistor R6 are connected to amplifier IC2 to turn it into a 50 KHZ oscillator. A 50 KHZ A.C. signal helps to stabilize the audio signal from the alarm watch. Capacitor C5 and resistor R6 are connected to prevent run-away feedback such as when a microphone is located too close to the loudspeaker. Capacitor C9 is connected to form a supply voltage filter capacitor. Resistor R7 and capacitor C10 form a bypass network.

The LED Audio Coupler

Capacitor C2 couples the output of amplifier IC1 to the base of transistor TR1. Transistor TR1 couples the signal from the alarm watch to LED 4. Light emitting diode LED 4 couples the signal to the trigger input of timer IC3. LED 4 is sensitive to several audio frequencies or tones applied for a short time. For example, a single tone at +85 decibels is not detected by the system but a group of different tones with fractions of a second duration at +75 decibels is detected by the system. LED 4 helps the system to discriminate against ordinary noises.

Transistor TR1 increases the sensitivity of the system to the watch alarm signal. Integrated circuit IC3 applies a D.C. voltage to power amplifier IC2. Circuit IC3 is in the high state for one second after LED 4 triggers the input of IC3. Resistor R21 and capacitor C22 establish the one second operation for circuit IC3. LED 3 is connected to the output of circuit IC3 as a test light to indicate the power amplifier is on. Resistor R23 limits the current for LED3. Circuit IC3 also applies a D.C. voltage to an automatic snooze circuit.

Tone Generators

Integrated circuits IC6 and IC7 are tone generators for generating the snooze tones. Resistors R18 and R17, capacitors C17 and circuit IC6 form an oscillator. Resistor R19 and R20 and capacitor C18 form a second oscillator.

The output of IC7 is fed to the control voltage input of IC6. This generates an old fashion alarm clock sound. Switch S3C connectors capacitor C19 in parallel with capacitor C18 to generate a two tone siren sound. Capacitor C14 supplies the A.C. ground for timers IC6 and IC7. The output of IC6 is fed through capacitor C15 and resistor R15 to input of power amplifier IC2. Switch S3D is the volume switch for the snooze tone. Switch S3D is closed to increase the tone from the snooze timer IC6 and IC7.

Automatic Snooze Circuit

Resistor R27 and a three volt zener diode D2 form a reference voltage for the automatic snooze circuit. Capacitor C11 charges through resistor R9 to the D.C. voltage at the junction of resistor R27 and zener diode D2. The D.C. voltage exists at that junction for one second when IC3 goes into a high state. When IC3 is not triggered into the high state, capacitor C11 discharges through diode D1. If IC3 is triggered fifteen consecutive times (+ or − three seconds) the D.C. voltage at the junction of capacitor C11 and resistor R9 is sufficient to activate silicone controlled rectifier SCR1. When SCR1 fires, integrated circuit timer IC4 is connected to ground and the timing cycle starts. The timing period is determined by the values of capacitor C12 and resistors R11 and R12. Resistor R26 is used to reduce the timing period for demonstration purposes. Switch S3B is the snooze time select switch. Switch S3B, in the closed position, gives ten minutes of snooze and in the open position gives twenty minutes of snooze operation. Demonstration snooze time is approximately one minute. Capacitor C13 keeps integrated circuit timer IC4 from going into a low state when silicon controlled SCR1 is being activated. Light emitting diode LED2 is the snooze "on" indicator and resistor R14 limits the current for LED2.

Switch S2 is connected to function as the snooze "on" snooze reset switch. Momentarily depressing switch S2 couples the D.C. voltage through resistor R13 to the gate of SCR1. When SCR1 conducts, it starts the timing cycle for timer IC4. When timer IC4 goes into the low state, integrated circuit timer IC5 is triggered into the high state and IC4 supplies the ground for tone generators IC6 and IC7. Capacitor C61 and resistor R16 are connected to apply pulses to the base of transistor TR1. This triggers IC3 into the high state. The output of timer IC5 applies D.C. voltage to power amplifier IC2. The tone generator continues to sound until the user resets the snooze or turns off the power. If IC3 is triggered ten times followed by a quiet period, capacitor C11 discharges during the quiet period to prevent a false alarm.

Battery Supply-Intrusion Alarm

Battery B1 provides the supply of electrical energy. Switch S3A is connected to the battery in the circuit to provide a power switch (on/off). Capacitor C20 is connected across the battery as a filter capacitor. Light emitting diode LED1 is connected across the battery as a power-on indicator. Resistor R22 limits the current through LED1.

Resistor R24 and switch S1A are for changing the time required to activate the automatic snooze circuit. These components are for the instruction circuit. Closing switch S1B causes IC4 to go into a low state when SCR1 is activated. The snooze alarm will sound right away. This system may be used to detect an intruder.

The LED—Audio Coupler

The audio coupler circuits consists of three components, a disc capacitor C21, NPN germanium transistor TR1, and light emitting diode LED4.

The audio signal is coupled through capacitor C21 to the base of transistor TR1. The audio signal is rectified by LED4 and the pulses are coupled to the trigger input of IC3. In stand-by mode, no D.C. voltage is applied to TR1.

The audio coupler circuit has two main functions. First, to allow the system to be on for a long period of time (five to ten hours) and still be sensitive enough to respond to the alarm watch. If a conventional diode or capacitor coupling is used, the system is not sensitive enought the next morning.

If the gain of preamplifier IC1 is increased to overcome the sensitivity problem, the system is too sensitive to normal room noises and causes false alarms.

The second function of the audio coupler circuit is to help discriminate against ordinary room noises during the night. LED 4 is sensitive to a combination of frequencies or tones made in a short period of time, for example, a fraction of a second.

The sound level generated by some alarm watches at a distance of one half inch from the watch is approximately +75 decibels (depending on the model and make of the watch being used). In a test, a measurement was taken with the IE-10, an audio spectrum analyzer and the Advance Chronograph watch. A music test record was used to generate a sound level of +85 decibels, one half inch from the microphone in the alarm device. This test record did not cause the alarm device to false alarm. The record was played for three minutes and contained both low and high frequencies. When monitoring the alarm watch with the audio spectrum analyzer, frequencies from 500 HZ to 12 KHZ would register on the meter with each beep from the watch.

A finger snap gave very similar indications on the audio spectrum analyzer. Frequencies from 32 HZ to 8 KHZ would register on the meter. The duration of a finger snap would be less than one second. To prove the above, the alarm device was placed on a table with the power switch on. A test record was used to generate a sound pressure level of +85 decibels one half inch from the microphone in the alarm device. While the music was playing, the system did not respond to the music. But it did respond to a very soft finger snap.

Light emitting diode LED4 is a device that gives off light when a D.C. voltage is applied to it. This is one normal use for LED4.

When used in the alarm device, LED4 effectively isolates TR1 and IC3 when the device is in the stand-by mode for several hours. Thus LED4 also discriminates against audio frequencies in a novel way.

This system would not work with ordinary filters because the variety of alarm watches on the market cover a wide band of frequencies. For example, the tone generated by some alarm watches is 2 KHZ and others 8 KHZ.

Another test was made to demonstrate the ability of the alarm device to be selective or discriminate against certain types of noises. A common alarm clock radio with an old type A.C. buzzer was used. The radio was placed approximately twelve inches from the microphone. The power switch was turned on and the clock radio was set to alarm. Although the clock radio sounded for five minutes, this noise did not cause the preferred circuit to respond.

Operation

The user first sets his alarm watch to the desired wake-up time. The watch is then placed into the box with the time display facing outwardly. The power switch is then turned on. Appproximately fifteen seconds after the alarm is energized, the green snooze light becomes energized. Ten minutes or other selected period of time after the snooze light is energized, the buzzer in the alarm device is actuated. The operator may turn the power switch off or reset the snooze by depressing the snooze on-button for another ten minutes.

Having described my invention, I claim:

1. An alarm device comprising:
a watch having means for producing an audio signal at a selected time;
audio amplifier means physically separated from said watch, and sensing means for energizing said audio amplifier means in response to an audio alarm produced by said watch; and
the audio amplifier means including a silicone element, and a microphone for amplifying the alarm, said microphone being partially embedded in the silicone element.

2. An alarm device comprising:
a watch having means for producing an audio alarm at a selected time;
audio amplifier means physically separated from said watch, and sensing means for energizing said audio amplifier means in response to an audio alarm produced by said watch; and
the sensing means including a microphone and a hollow, cone-shaped member mounted on the front of the microphone for receiving an audio signal in a predetermined direction.

3. An alarm device comprising:
a watch having means for producing an audio alarm at a selected time;
audio amplifier means physically separated from said watch, and sensing means for energizing said audio amplifier means in response to an audio alarm produced by said watch; and
the audio amplifier means including a silicone dampening element and a speaker partially embedded in the silicone element.

4. An alarm device comprising:
a watch having means for producing an audio alarm at a selected time;
audio amplifier means physically separated from said watch, and sensing means for energizing said audio amplifier means in response to an audio alarm produced by said watch; and
said audio amplifier means includes an electrical battery means, a speaker, a power amplifier connected to the battery means and to the speaker, and power amplifier timing means connected to the power amplifier such that the speaker is energized only if the audio signal received by the sensing means is received for a predetermined period.

5. An alarm device comprising:
a watch having means for producing an audio alarm at a selected time;
audio amplifier means physically separated from said watch, and sensing means for energizing said audio amplifier means in response to an audio alarm produced by said watch; and
a box having a pivotally connected top, the box having support means for receiving the watch, a first speaker mounted in the top, and a second speaker remotely connected to the amplifier means.

6. An alarm device comprising:
a watch having means for producing an audio alarm at a selected time;
audio amplifier means physically separated from said watch, and sensing means for energizing said audio amplifier means in response to an audio alarm produced by said watch; and
a light emitting diode connected in the audio amplifier means for discriminating against certain audio frequencies such that the amplifier means is not activated in response to such frequencies.

7. An alarm device as defined in claim 6 including a tone generator and means for energizing said tone generator such that the amplifier means is activated by a non-discriminated audio frequency that continues for a selected period of time.

* * * * *